(12) United States Patent
Wickramanayaka et al.

(10) Patent No.: US 7,164,571 B2
(45) Date of Patent: Jan. 16, 2007

(54) WAFER STAGE WITH A MAGNET

(75) Inventors: Sunil Wickramanayaka, Tokyo (JP); Yoshikazu Nozaki, Palo Alto, CA (US)

(73) Assignee: Anelva Corporation, Tokyo (JP)

( * ) Notice: Subject to any disclaimer, the term of this patent is extended or adjusted under 35 U.S.C. 154(b) by 30 days.

(21) Appl. No.: 10/906,435

(22) Filed: Feb. 19, 2005

(65) Prior Publication Data
US 2005/0185359 A1    Aug. 25, 2005

(30) Foreign Application Priority Data
Feb. 19, 2004    (JP) .............................. 2004-042323

(51) Int. Cl.
  *H01L 21/683* (2006.01)
  *H01T 23/00* (2006.01)
  *H01L 21/00* (2006.01)
  *H01L 21/302* (2006.01)
  *H01L 21/461* (2006.01)
  *H01L 31/306* (2006.01)
  *C23F 1/00* (2006.01)

(52) U.S. Cl. .................... 361/234; 438/5; 438/710; 156/345

(58) Field of Classification Search ............... 361/234; 438/5, 710; 156/345
See application file for complete search history.

(56) References Cited

U.S. PATENT DOCUMENTS
2004/0009617 A1 * 1/2004 Masuda et al. ................. 438/5
2004/0196127 A1 * 10/2004 Perrin ......................... 335/299

FOREIGN PATENT DOCUMENTS
JP       05-291194       11/1993
JP       06-061336       3/1994
JP       07-086382       3/1995
JP       09-134892       5/1997

* cited by examiner

*Primary Examiner*—Stephen W. Jackson
*Assistant Examiner*—Dharti H. Patel
(74) *Attorney, Agent, or Firm*—Buchanan Ingersoll & Rooney PC

(57) ABSTRACT

A wafer stage for holding a wafer in a chamber of a plasma processing system, the wafer stage includes an electrode on which a wafer is placed, to which electrical current is supplied, a diameter of the electrode is larger than a diameter of said wafer, a plurality of magnets separately arranged on an outermost region of said electrode and said magnets are arranged such that alternate magnetic poles face towards the inside of the chamber, and an outer-ring placed around said wafer, the outer ring having a magnetic metal ring at a lower side.

17 Claims, 8 Drawing Sheets

WAFER STAGE WITH A MAGNET

BACKGROUND OF THE INVENTION

1. Field of the Invention

The present invention relates to a wafer stage, and to a technique to fix an outer-ring on the wafer stage to improve the thermal conductance between the outer-ring and an electrode arranged in the wafer stage.

2. Description of the Related Art

Plasma assisted wafer processing technique is well-established process in the fabrication of semiconductor devices on Si or other wafers or substrates. Most of the wafer processes are carried out at a controlled temperature because desired chemical and/or physical reactions are occurred only at a specific temperature or a temperature range. The wafer temperature is normally controlled by placing the wafer on a temperature-controlled electrode arranged in a wafer stage while the wafer is pressed to the electrode by mechanical or electrostatic fixing techniques. The wafer stage has a thermal mechanism that gives heat to the electrode. In addition, a high-pressure gas is fed into a very thin gas reservoir made between the wafer and the electrode in order to increase the thermal conductance between them. This technique is generally good enough to maintain the wafer temperature within a desired temperature range.

Some of the wafer processes are very sensitive to wafer temperature as it changes the gas chemistry over the wafer surface. For these processes, not only the wafer temperature is important, but also the temperatures of other surfaces, which lies very close to the wafer, particularly an outer-ring, are also important. If the outer-ring that lies around the wafer is at a different temperature, a different process occurs on the outer-ring surface and generates different gas chemistry on its surface. This adversely affects the chemistry on the wafer surface for the outermost region of the wafer surface specially. These problems are explained in detail by considering a conventional wafer stage used in dielectric etching process. Two different conventional examples are explained as follows.

FIG. 6 shows a conventional wafer stage 100 normally used in dielectric etching as one example. The wafer stage 100 is comprised of an electrode 101, a thin dielectric plate 102 attached to the upper surface of the electrode 101, an outer-ring 103 and dielectric shields 104, 105 and 106. Within the electrode 101, a plurality of canals 107 is made to flow a temperature-controlled liquid in order to control the temperature of the electrode 101. The electrode 101 is connected to a rf power source 109 via a matching circuit 108. A wafer not shown in FIG. 6 is placed on the dielectric plate 102. It is noted that one may supply a DC voltage to the electrode 101 from a DC power source. This is to electrostatically clamp the wafer onto the dielectric plate 102. However, even in the absence of additional DC voltage applied to the electrode 101, wafer may be electrostatically clamped onto the dielectric plate 102 by the self-bias voltage generated on the wafer surface.

During the operation of the wafer stage 100 in the dielectric etching process, the rf power is applied to the electrode 101 in order to generate a self-bias voltage ($V_{dc}$) on the wafer surface. The electric field generated due to the self-bias voltage $V_{dc}$ accelerates ions on to the wafer surface. The bombardment of the ions causes etching of the wafer surface. In the dielectric etching process, there are two different chemistries on the wafer surface; one is ion-assisted etching and the other is neutral radical or molecule-assisted film deposition. For example, with the conventional gases such as $C_4F_8/Ar/O_2$, polymer deposition occurs on the surfaces facing the plasma.

The above polymer deposition chemistry is very sensitive to the wafer temperature, such as deposition rate increase with a decrease of the wafer temperature. Here the surface can be any material such as wafer or other surfaces facing the plasma. This means, if the surface temperature is higher, most of the polymer deposition radicals that bombard on the surface are reflected back to the plasma. This causes an increase of polymer depositing radicals in the plasma at the vicinity of heated surfaces. Conversely, at the vicinity of cold surfaces, the concentration of polymer depositing radicals is lower. The concentration of polymer depositing radicals in the plasma greatly affects the etching rate and etching profile on the wafer surface. Therefore, over the entire wafer surface it is essential to have a constant polymer depositing radical concentration.

The temperature of the electrode 101 shown in FIG. 6 is controlled by flowing a liquid through the canals 107. Therefore, wafer temperature is controlled throughout the etching process. However, the temperature of the outer-ring 103 gradually increases as it is exposed to the plasma, because the outer-ring 103 is simply placed on the insulating material 104 and it is a replacement part. This causes a bigger difference of temperatures between the outer-ring 103 and the wafer. As a result, the gas chemistries over the outer-ring 103 and the wafer become different. The gas chemistry over the outer-ring greatly affects the process chemistry on the outermost region of the wafer. Therefore, the process chemistry at the central region and at the outer region of the wafer becomes different and hence cannot be used in device fabrication, as there is no uniform process over the wafer surface.

FIG. 7 shows another conventional wafer stage used in dielectric etching as the second example. In the structure shown in FIG. 7, components substantially identical to the components shown in FIG. 6 are respectively designated by the same reference numerals. In the second example shown in FIG. 7, the electrode 101 and modification of the thin dielectric plate 102 are expanded more than the diameter of the wafer. When the rf power is applied to the electrode 101, both the wafer and the outer-ring 103 get electrostatically clamped on the dielectric plate 102. This increases the thermal conductance between the outer-ring 103 and the electrode 101. Therefore, the outer-ring 103 also gets the same temperature as that of the wafer. This eliminates the generation of different gas chemistries on the wafer and the outer-ring 103.

However, there is a problem in this structure too. This problem is explained with reference to FIG. 8 showing an enlarged view of a part of the outer-ring 103 and the dielectric plate 102. As mentioned before, during the etching process, the polymer is deposited on the surfaces that face the plasma. With an increase of etching time, the polymer 111 is deposited within the small cavity 112 between the outer-ring 103 and the dielectric plate 102. When the wafers are running, the outer-ring 103 gets clamped and de-clamped repeatedly with the change of each wafer. Continuous clamping and de-clamping causes minute movements of the outer-ring 103. This generates small polymer particles and a few of these particles may go between the outer-ring 103 and the dielectric plate 102. When the polymer particles lie between the outer-ring 103 and the dielectric plate 102, electrostatic clamping does not work. In this case the temperature of the outer-ring rises. This results in different gas chemistries over the outer-ring 103 and the wafer due to the reasons mentioned before.

Accordingly, even electrostatic clamping of the outer-ring 103 is not a promising technique to control the outer-ring temperature. Further, even though the problems in controlling the outer-ring temperature is explained with reference to a dielectric etching system, the same problem can be seen in numerous other plasma processing systems.

Three patent documents, that is JP-A-7-86382, JP-A-6-61336 and JP-A-5-291194 disclose wafer or substrate holding stages similar to the above-mentioned conventional structures as to the wafer stage. Further, as a related art, JP-A-9-134892 discloses the mechanism for fixing a wafer on a table using a magnet. The magnet is used for fixing a ring member disposed around the wafer at lower side. The above fixing mechanism is built in a dicing machine that is considerably different from the plasma-assisted wafer processing system.

The subject of the present invention is to solve the above problems and to surely fix the outer-ring to the electrode of the wafer stage by using the magnet force and to improve the thermal conductance between the outer-ring and the electrode. Thereby the temperature of the outer-ring is controlled to be a desired temperature.

OBJECTS AND SUMMARY

An object of the present invention is to provide a wafer stage capable of improving the thermal conductance between the outer-ring and the electrode so as to control the temperature of the outer-ring to be optimum, and removing the effect of the polymer particles.

A wafer stage in accordance with an embodiment of the present invention is configured as follows in order to attain the above-mentioned object.

The wafer stage is used for holding a wafer in a plasma processing system. The wafer stage is comprised of an electrode on which the wafer is placed, to which electrical current is supplied, whose diameter is larger than a diameter of the wafer, a plurality of magnets separately arranged on a place corresponding to an outermost region of the electrode by radial directions arrangement and the magnets are arranged with alternate polarity to face the magnetic poles towards the inside of chamber, and an outer-ring placed around the wafer, having a magnetic metal ring at a lower side.

In the accordance with the above wafer stage, the electrode is expanded more than the wafer diameter, and the outer-ring is attached to the top surface of the wafer stage by using magnetic force. This magnetic force is generated between the plurality of magnets arranged on the predetermined outermost region and the magnetic metal ring fixed on the lower surface of the outer-ring.

In the above-mentioned wafer stage, preferably, a plurality of magnets is placed in a concentric position arrangement instead of the radial directions arrangement.

In the above-mentioned wafer stage, the electrode is preferably provided with a dielectric plate attached to its upper surface, and the plurality of magnets is fixed on the outermost region of the dielectric plate.

In accordance with the above structure, the electrode and the thin dielectric plate are expanded more than wafer diameter, and the outer-ring is attached to the thin dielectric plate by using the magnetic force. This magnetic force is generated between the magnets fixed on the outermost region of the dielectric plate and the magnetic metal ring.

In the above-mentioned wafer stage, preferably, the plurality of magnets is directly fixed on the outermost region of the electrode.

In the above-mentioned wafer stage, the dielectric plate includes an electrostatic chuck device.

In the above-mentioned wafer stage, preferably, the positions of the magnets are reversed, and the magnets is arranged on the lower surface of the outer-ring and the magnetic metal ring is arranged on the outermost region.

The wafer stage of the present invention can improve the thermal conductance between the outer-ring and the electrode and control the temperature of the outer-ring to become a desired temperature regardless of the plasma state or the amount of polymer particles contamination.

BRIEF DESCRIPTION OF THE DRAWINGS

These and other objects and features of the present invention will become clearer from the following description of the preferred embodiments given with reference to the attached drawings, wherein.

DESCRIPTION OF THE PREFFERED EMBODIMENTS

Figure 1:
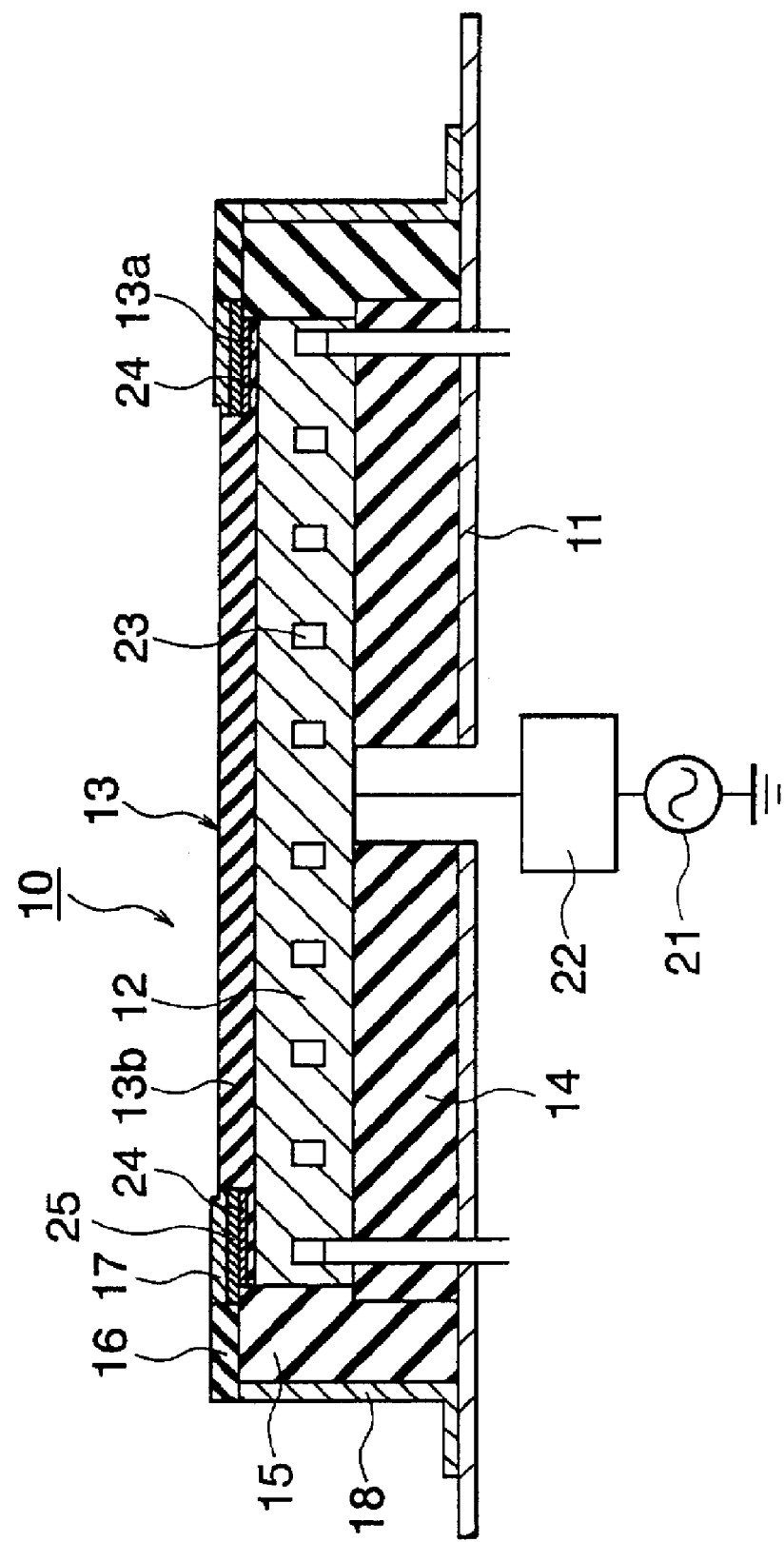
FIG. 1 is a longitudinal cross sectional diagram showing the wafer stage of a first embodiment of the present invention.

Hereinafter, preferred embodiments will be explained according to the attached drawings. Through the explanation of the embodiments, the details of the present invention will be clarified. A first embodiment of the present invention is explained with reference to FIGS. 1 and 2. FIG. 1 shows a vertical cross sectional view of a wafer stage 10 in accordance with the first embodiment. This wafer stage 10 is built into a plasma-assisted wafer processing system as a mechanism for loading a wafer to be processed in a processing chamber (not shown). For the convenience of explanation, only the wafer stage 10 is shown in FIG. 1. The wafer stage 10 has a feature for fixing an outer ring on the wafer stage 10.

The wafer stage 10 shown in FIG. 1 is arranged on a lower wall 11 of the processing chamber. The wafer stage 10 is comprised of an electrode 12, a thin dielectric plate 13 fixed on the upper surface of the electrode 12, an insulating materials 14, 15 and 16, and an outer-ring 17.

The wafer stage 10 has a ring-shaped side wall 18 fixed to the lower wall 11. The insulating material 14 is fixed the lower wall 11 and the electrode 12 is placed on the upper surface of the insulating material 14. The insulating material 15 having a ring-shape is placed around both the insulating material 14 and the electrode 12. The ring-shaped insulating material 15 is in contact with the inner surface of the side-wall 18.

The outer-ring 17 is placed around the place of the thin dielectric plate 13 on which a wafer to be processed is loaded. In addition the outer-ring 17 is placed in the inside space of a ring-shaped insulating material 16 so as to make one plane. Further, the insulating material 16 is arranged on the top surface of the insulating material 15.

The above electrode 12 is supplied a rf current from a rf generator 21 through a matching circuit 22. The electrode 12 is insulated from the lower wall 11 and the like by the insulating materials 14 and 15. In addition, electrode 12 may also be connected to a DC power supply. This structure is not shown in FIG. 1.

There are some canals 23 within the electrode 12 to cause a temperature-controlled liquid to flow. By the flow of the temperature-controlled liquid through the canals 23, the temperature of the electrode 12 is controlled to maintain a desired value or range. In FIG. 1, the illustration of a supply mechanism for supplying the temperature-controlled liquid is omitted. Usually, the supply mechanism is arranged in the outside of the wafer stage 10 and connected with the canals 23 through an inlet and an outlet.

Figure 2:
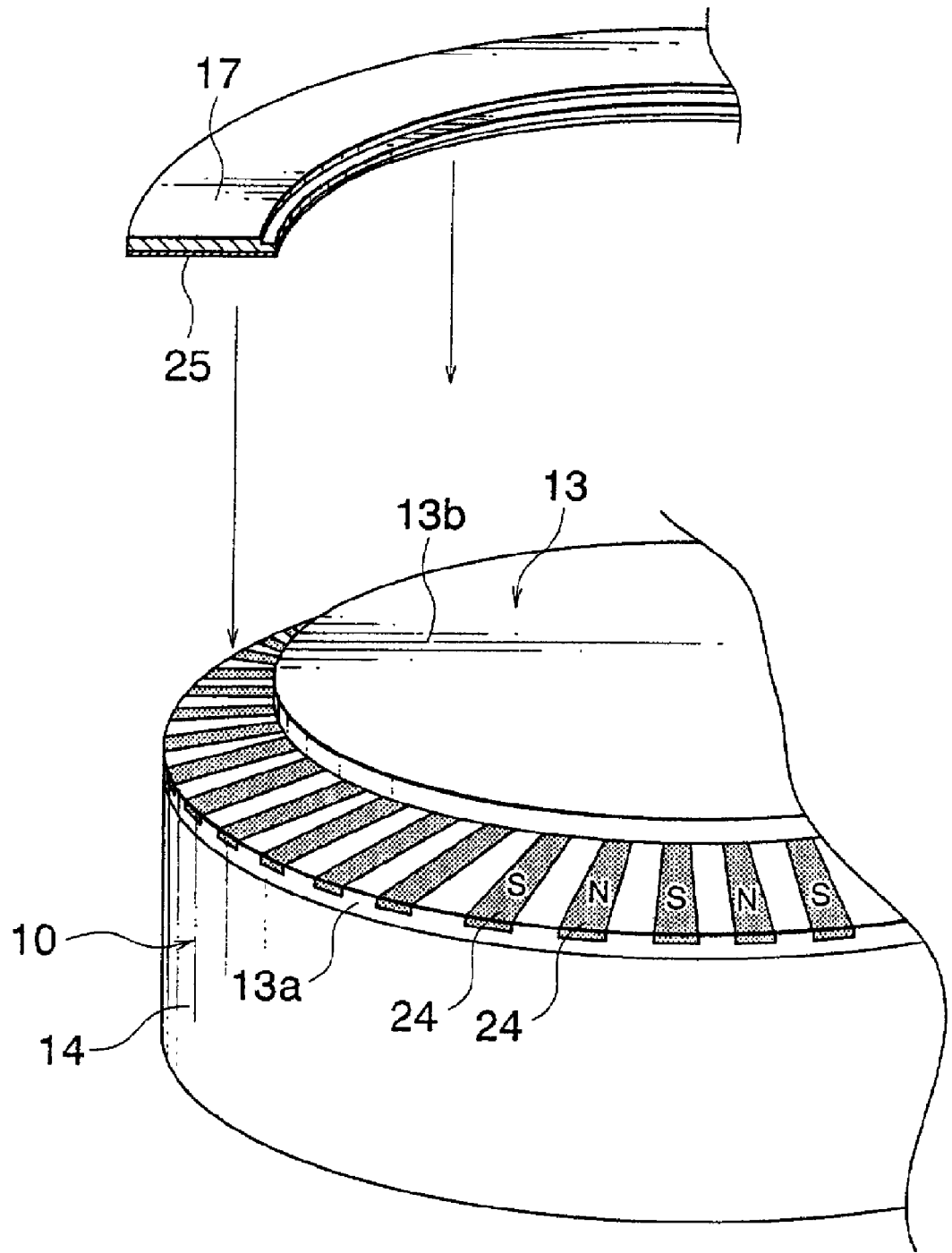
FIG. 2 is an enlarged partial perspective view of the wafer stage showing the magnet arrangement and the magnetic metal ring arrangement.

The thickness of the thin dielectric plate 13, which is arranged on the top surface of the electrode 12, is not critical. It is usually smaller than 5 mm. The wafer is directly placed on the dielectric plate 13. The diameter of the dielectric plate 13 is preferably slightly larger than the diameter of the wafer. For example, if the wafer diameter is 200 mm, the diameter of the dielectric plate 13 may lie in the range from a dimension larger than 200 mm to 250 mm. When the diameter of the dielectric plate 13 is larger than the wafer diameter, the outermost region 13a that lies over the wafer diameter is taken slightly thinner than the central region 13b as shown in FIGS. 1 and 2. The central region 13b is used as the place on which the wafer to be processed is loaded.

On the above thinner outermost region 13a, a plurality of magnets 24 is arranged with alternate polarity (N and S magnetic poles). As shown in FIG. 2 especially, each magnet 24 is a thin and long plate piece with a small width, and all of the magnets 24 are respectively disposed in radial directions. The length of the magnet 24 is as same as the width of the outermost region 13a. In actual, the magnets 24 are preferably buried on the surface of the outermost region 13a of the dielectric plate 13 in a state of exposing their magnetic pole surface.

There is no critical magnet arrangement. The magnet arrangement shown in FIG. 2 is merely one example. The magnets 24 are arranged in radial lines with alternate polarity and the magnetic poles are facing the inside of the plasma-processing reactor.

The height of the magnet 24 is not critical and taken as thin as possible, for example, around 1 mm. As to the magnets 24, the dimensions and strength of the magnetic field are also not critical. Usually, the magnets 24 with weak magnetic fields, for example, a magnetic field strength on the surface of magnet 24 smaller than 500 Gauss, are selected.

Figure 3:
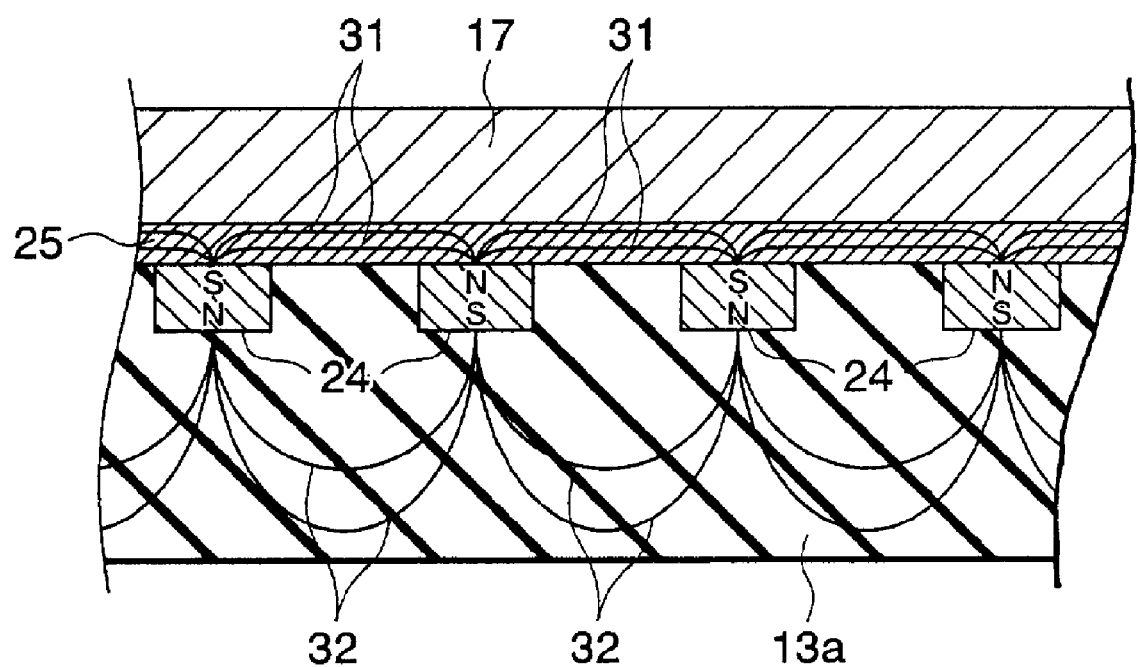
FIG. 3 is a partial cross sectional view showing the direction and distribution-state of the magnetic fluxes based on the magnets.

The above-mentioned outer-ring 17 shown in FIGS. 1 and 2 is usually made of a semiconductor material or member such as Si, or a dielectric material such as Quartz. The thickness of the outer-ring 17 is not critical and usually lies around 2 mm. On the lower surface of the outer-ring 17, a magnetic metal ring 25, which is made of iron for example, is firmly attached to have better thermal conductance between them. Usually, the outer and inner diameters of the magnetic metal ring 25 are taken as the same as those of the outer-ring 17. The thickness of the magnetic metal ring 25 is also not critical and lies smaller than 1 mm. When this composite ring comprised of the outer-ring 17 and the magnetic metal ring 25 is placed on the wafer stage 10, it firmly get fixed on the outermost region 13a of the thin dielectric plate 13 by magnetic forces based on the magnets 24. Because, magnetic flux lines emitted from one magnetic pole of the magnets 24 passes to the opposite magnetic pole thereof through the magnetic metal ring 25. This is schematically shown in FIG. 3. In FIG. 3, reference numerals 31 and 32 designate magnetic fluxes showing the magnetic fields generated by the magnets 24.

The strength of the above-mentioned magnetic fields generated by the magnets 24, distance or separation between any two of the magnets 24, dimensions of the magnets 24, and thickness of the magnetic metal ring 25 are selected so that the above magnetic fluxes 31 do not reach the upper surface of the outer-ring 17. The upper magnetic fluxes 31 are distributed in the limited inner region of the magnetic metal ring 25. That is, the upper magnetic fluxes 31 pass only within the magnetic metal ring 25.

As to the dielectric plate 13, the diameter thereof may be selected to be substantially equal to the wafer diameter as a modification of the first embodiment. In this case, when the wafer diameter comes to be 200 mm, the diameter of the dielectric plate 13 is almost 200 mm. If the diameter of the thin dielectric plate 13 is almost the same as the wafer diameter, the above-mentioned magnets 24 are directly fixed on the electrode 12 and the space between two of the magnets 24 is filled with an insulating material.

In the structure of the wafer stage 10, the above technique for fixing the outer-ring 17 on the electrode 12 improves the physical contact between the magnetic metal ring 25 and the thin dielectric plate 13 or the electrode 12. Therefore, this structure can improve the thermal conductance between the outer-ring 17 and the electrode 12. Further, this tight-attachment of the outer-ring 17 to the electrode 12 remains constant regardless of plasma on or off. Therefore, this technique can improve the thermal stability of the outer-ring 17. Owing to this time-invariant tight-attachment, there is no possibility that the polymer particles go between the magnetic metal ring 25 and the thin dielectric plate 13. Moreover, the polymer deposition between the outer-ring 17 and the thin dielectric plate 13 as explained in the prior art section, do not cause any problem for the magnetic force attachment. Because, even if the polymer particles go between the magnetic metal ring 25 and the thin dielectric plate 13, it does not cause weakening of the magnetic force. Therefore, there is no uncertainty of the temperature of the outer-ring 17 with the polymer growth in the cavity.

Figure 4:
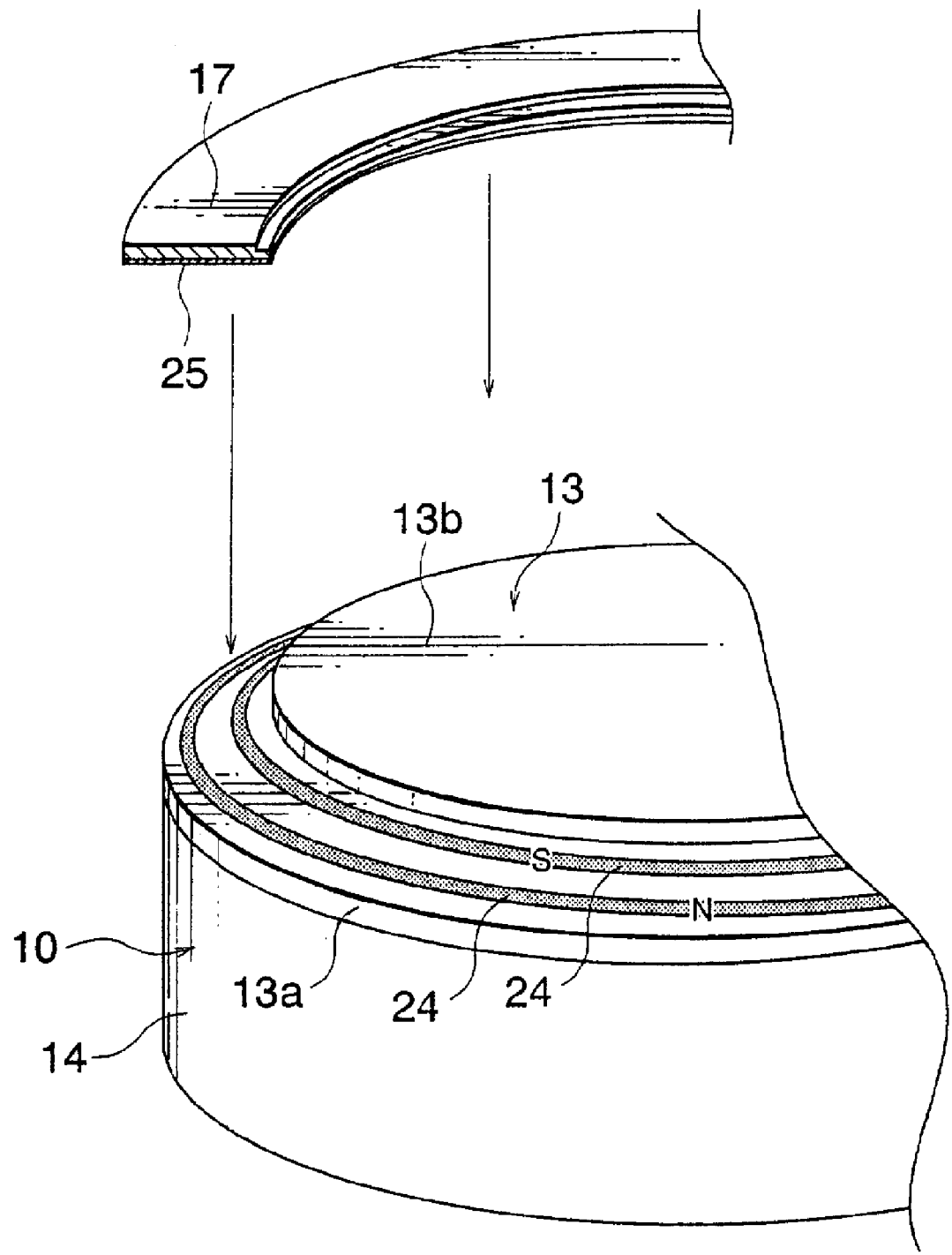
FIG. 4 is an enlarged partial perspective view of the wafer stage showing another configuration of the magnet arrangement and the magnetic metal ring arrangement.

Next, FIG. 4 shows another possible configuration for the magnet arrangement as a modification. In this magnet arrangement, two ring-shaped magnets respectively having different diameters are arranged on the thin outermost region 13a of the thin dielectric palate 13. The two ring-shaped magnets are placed in a positional relationship of a cocentric circle. This magnet arrangement configuration makes the structure simple and reduces the number of the magnets.

In accordance with the above-mentioned first embodiment, the technique to fix the outer-ring on the wafer stage can improve the thermal conductance between the outer-ring and the electrode, and give a means to control the outer-ring temperature to lie at a desired temperature or in a temperature range regardless of the state of plasma or the amount of polymer particles contamination.

Figure 5:
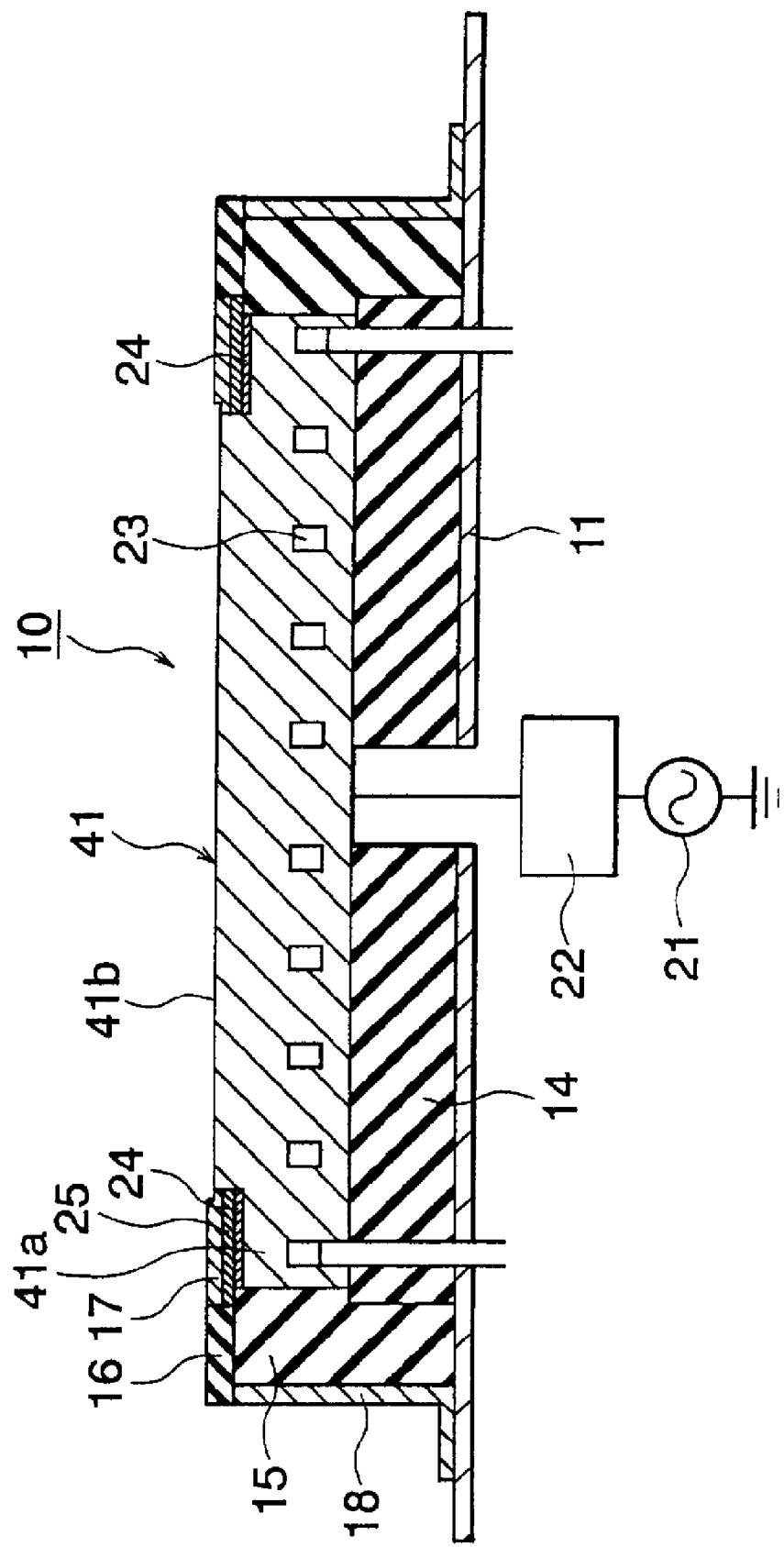
FIG. 5 is a longitudinal cross sectional diagram showing the wafer stage of another embodiment of the present invention.
Figure 6:
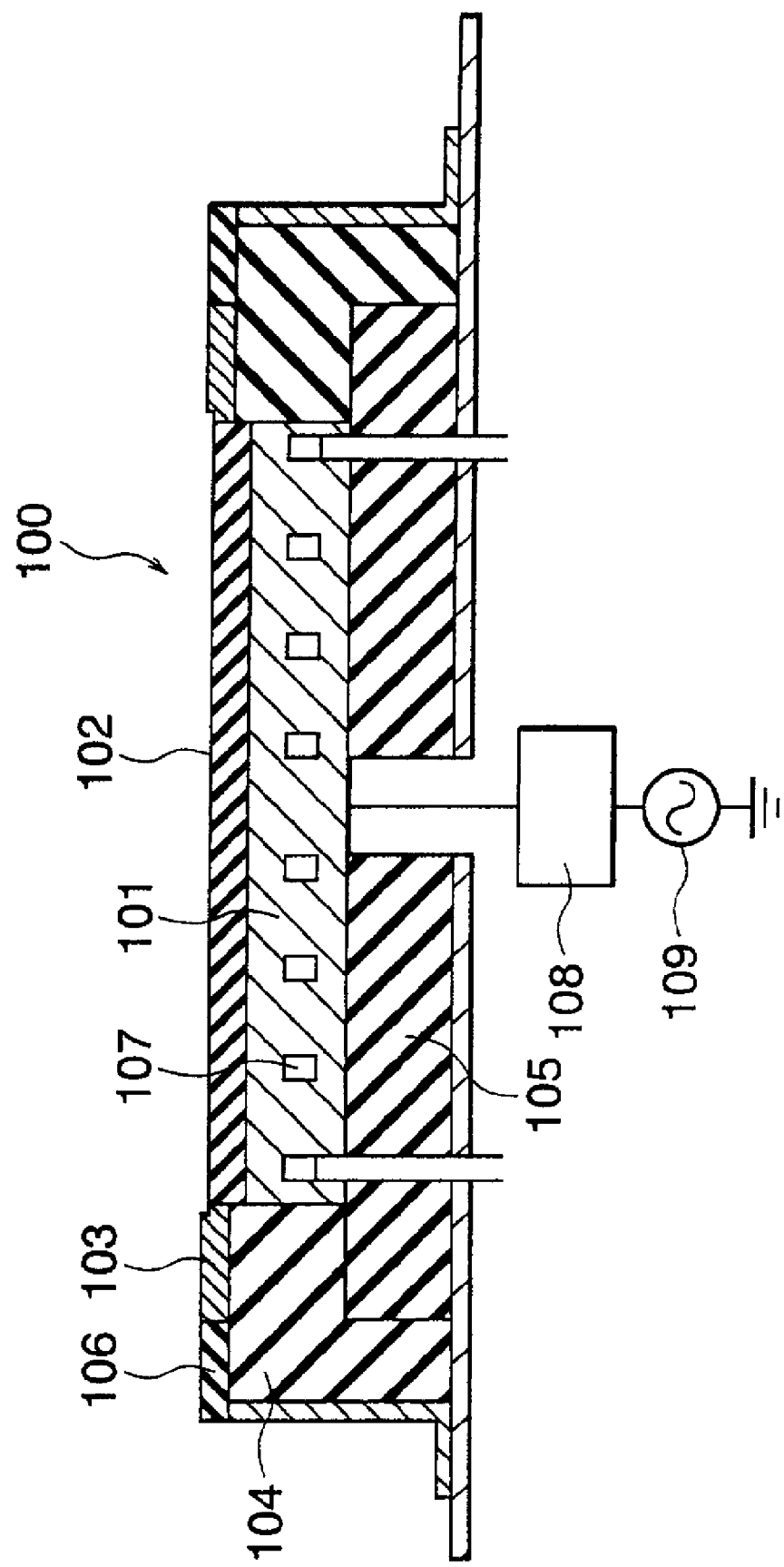
FIG. 6 is a longitudinal cross sectional diagram showing a first conventional wafer stage used for dry etching.
Figure 7:
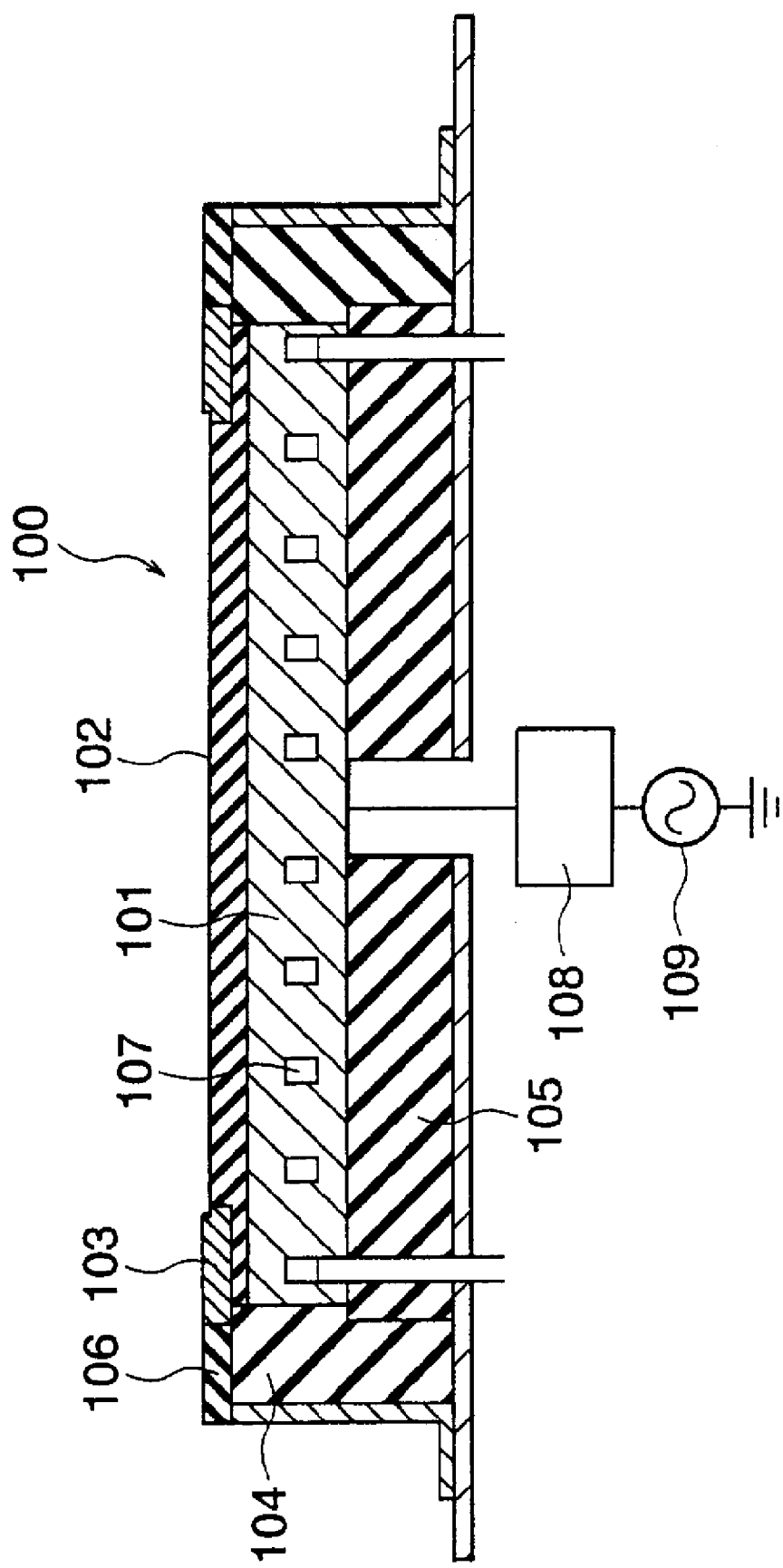
FIG. 7 is a longitudinal cross sectional diagram showing a second conventional wafer stage for dry etching.
Figure 8:
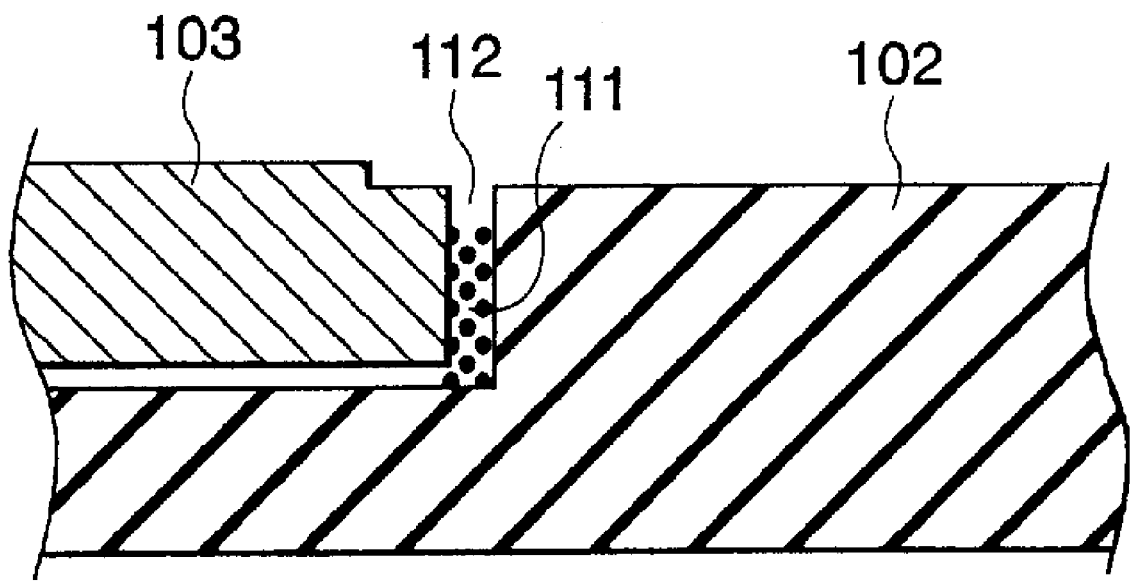
FIG. 8 is an enlarged cross sectional view showing the spot where polymer is deposited.

Another embodiment is an extension of the above-mentioned first embodiment and is explained with reference to FIG. 5. In this embodiment, the only difference is that there is no thin dielectric plate 13 on the upper surface of the above electrode 12. Instead, the wafer stage 10 has an electrode 41 whose thickness is larger than that of the electrode 12 and the wafer to be processed is placed directly on a central section of a top surface of the electrode 41. The shape of the top surface of the electrode 41 is substantially as same as that of the above-mentioned thin dielectric plate 13. Therefore, the top surface of the electrode 41 has a central region and an outermost region. The central region is used as the place on which the wafer to be processed is loaded and the outermost region is the place on which the outer ring 17 is arranged. In FIG. 5, components substantially identical to those explained in the first embodiment are designated by the same reference numerals.

The diameter of the electrode 41 is taken few centimeters larger than the diameter of the wafer. The electrode 41 has two different heights as shown in FIG. 5. The height of the outermost region 41a of electrode 41, where the diameter is larger than the wafer diameter, is taken slightly shorter than the central region 41b. On the outermost region 41a, a plurality of magnets 24 is attached as explained in the first embodiment. The space between any two magnets 24 may be filled with an insulating material or the same material that the electrode 41 is made of. Other hardware associated with the electrode 41 in the wafer stage 10 are the same as that explained in the first embodiment.

The configuration of the outer-ring 17 and the magnetic metal ring 25 is the same as that explained in the first embodiment. The method of operation and the merits of the configuration of this embodiment are also the same as those explained in the first embodiment. That is, the outer-ring temperature can be controlled to have a temperature within the desired range. However, since there is no thin dielectric plate on the electrode surface, the wafer cannot be electrostatically clamped on the electrode 41. Therefore, wafer temperature cannot be precisely controlled in a comparison with the first embodiment.

The above-mentioned embodiments are explained by attaching a plurality of magnets 24 on the electrode or on the thin dielectric plate, and attaching the magnetic metal ring 25 on the lower surface of the outer-ring 17. However, one can change this arrangement, that a plurality of magnets can be fixed on the lower surface of the outer-ring, and the magnetic metal ring can be fixed on the electrode, in order to get the same result.

In an alternative embodiment, similar to that illustrated in FIG. 4, a single circular magnet may be used, wherein the single magnet has one pole extending along the outer diameter thereof and an opposite pole extending along the inner diameter thereof.

The present disclosure relates to subject matter contained in Japanese Patent Application No. 2004-42323 filed on Feb. 19, 2004, the disclosure of which is expressly incorporated herein by a reference in its entirety.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A wafer stage for holding a wafer in a chamber of a plasma processing system, the wafer stage comprising:
   an electrode on which a wafer is placed, to which electrode an electrical current is supplied, the electrode including a wafer receiving surface, a diameter of the electrode is larger than a diameter of said wafer receiving surface,
   at least one magnet arranged on an outermost region of said electrode, and
   an outer-ring placed on the electrode around said wafer receiving surface, the outer ring having a magnetic metal ring at a lower side thereof facing the at least one magnet, and
   said at least one magnet constructed and arranged such that magnetic flux from the at least one magnet passes through the magnetic metal ring to secure the outer-ring to the at least one magnet.

2. The wafer stage as claimed in claim 1, wherein said at least one magnet and the outer ring are arranged outside of the wafer receiving surface.

3. A wafer stage for holding a wafer in a chamber of a plasma processing system, the wafer stage comprising: an electrode on which a wafer is placed, to which electrode an electrical current is supplied, the electrode including a wafer receiving surface, a diameter of the electrode is larger than a diameter of said wafer receiving surface, a plurality of magnets separately arranged on an outermost region of said electrode, and an outer-ring placed around said wafer, the outer ring having a magnetic metal ring at a lower side thereof, the outer ring arranged such that magnetic flux from the plurality of magnets passes through the magnetic metal ring to secure the outer-ring to the plurality of magnets.

4. The wafer stage as claimed in claim 3, wherein said plurality of magnets and the outer ring are arranged outside of the wafer receiving surface.

5. The wafer stage as claimed in claim 3, wherein said plurality of magnets are arranged concentrically with respect to each other.

6. The wafer stage as claimed in claim 3, wherein said plurality of magnets are arranged radially with alternate polarity facing toward a center of the chamber.

7. The wafer stage as claimed in claim 5, wherein said electrode is provided with a dielectric plate attached to its upper surface, and said plurality of magnets are fixed on the outermost region of said dielectric plate.

8. The wafer stage as claimed in claim 6, wherein said electrode is provided with a dielectric plate attached to its upper surface, and said plurality of magnets are fixed on the outermost region of said dielectric plate.

9. The wafer stage as claimed in claim 3, wherein said plurality of magnets are directly fixed to the outermost region of said electrode.

10. The wafer stage as claimed in claim 5, wherein said plurality of magnets are directly fixed to the outermost region of said electrode.

11. The wafer stage as claimed in claim 6, wherein said plurality of magnets are directly fixed to the outermost region of said electrode.

12. The wafer stage as claimed in claim 7, wherein said dielectric plate includes an electrostatic chuck device.

13. The wafer stage as claimed in claim 8, wherein said dielectric plate includes an electrostatic chuck device.

14. A wafer stage for holding a wafer in a chamber of a plasma processing system, the wafer stage comprising: an electrode on which a wafer is placed, to which electrode an electrical current is supplied, the electrode including a wafer receiving surface, a diameter of the electrode is larger than a diameter of said wafer receiving surface, a magnetic metal ring arranged on an outermost region of said electrode, an outer-ring placed around said wafer, the outer ring having a plurality of magnets separately arranged on an underside of the outer ring and said magnets are arranged such that alternate magnetic poles face towards the inside of the chamber, and said plurality of magnets are arranged such that magnetic flux from the magnets passes through the magnetic metal ring to secure the outer-ring to the magnetic metal ring.

15. The wafer stage as claimed in claim 1, wherein the magnet is arranged such that the magnetic flux from the at least one magnet secures the outer-ring to the wafer stage inside the chamber of the plasma processing system.

16. The wafer stage as claimed in claim 3, wherein the magnet is arranged such that the magnetic flux from the plurality of magnets secures the outer-ring to the wafer stage inside the chamber of the plasma processing system.

17. The wafer stage as claimed in claim 14, wherein the magnet is arranged such that the magnetic flux from the plurality of magnets secures the outer-ring to the wafer stage inside the chamber of the plasma processing system.

* * * * *